United States Patent [19]
Koshikawa

[11] Patent Number: 5,502,684
[45] Date of Patent: Mar. 26, 1996

[54] SEMICONDUCTOR MEMORY HAVING HIGH SPEED AND LOW POWER DATA READ/WRITE CIRCUIT

[75] Inventor: Yasuji Koshikawa, Tokyo, Japan

[73] Assignee: NEC Corporation, Tokyo, Japan

[21] Appl. No.: 351,650

[22] Filed: Dec. 7, 1994

[30] Foreign Application Priority Data

Dec. 15, 1993 [JP] Japan .................................. 5-314638

[51] Int. Cl.[6] .................................................. G11C 7/00
[52] U.S. Cl. ...................... 365/230.06; 365/203; 365/233
[58] Field of Search ............................... 365/203, 230.06, 365/189.11, 233, 194, 189.05

Primary Examiner—Joseph A. Popek
Attorney, Agent, or Firm—Sughrue, Mion, Zinn Macpeak & Seas

[57] ABSTRACT

A semiconductor memory, particularly a sychronous DRAM which includes a bus driving circuit driving read/write buses to first and second potentials in a write operation, a data amplifier driving the read/write buses to third and fourth potentials in a read operation, and a precharge control circuit precharging the data read/write buses to a precharge level to a predetermined level after the write operation has completed.

8 Claims, 8 Drawing Sheets

SEMICONDUCTOR MEMORY HAVING HIGH SPEED AND LOW POWER DATA READ/WRITE CIRCUIT

BACKGROUND OF THE INVENTION

1. Field of the Invention

The present invention relates to a semiconductor memory device and, more particularly, to an improvement in a data read/write circuit in a so-called synchronous dynamic random access memory (synchronous DRAM).

2. Prior Art

Figure 5:
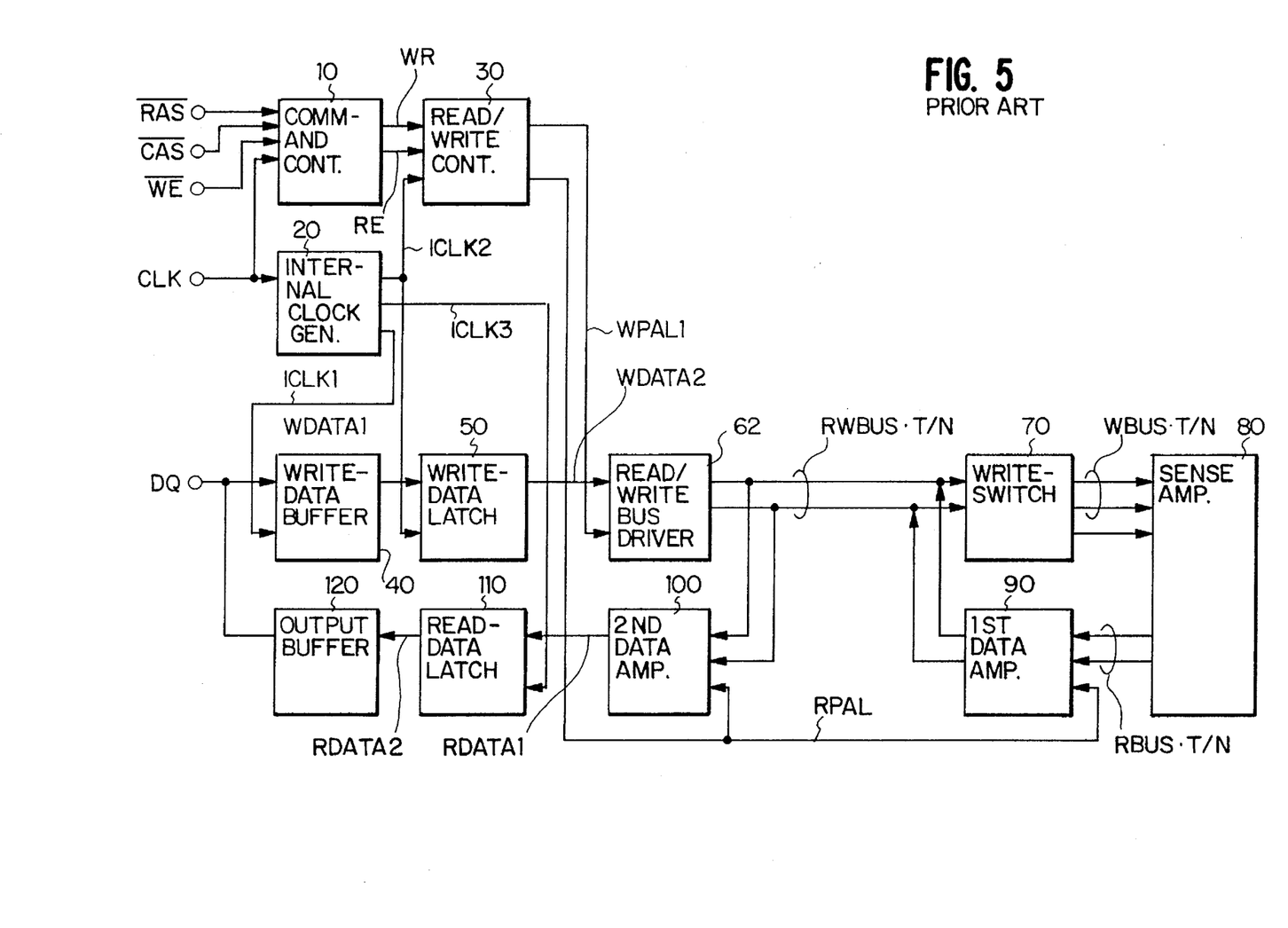
FIG. 5 is a block diagram showing a conventional example.

Recently, with a tendency to increase the operation speed of a microprocessor unit (MPU), the demand for increasing of the operation speed of a semiconductor memory device is rising. To this end, various high-speed memories are proposed. One of among them, there is a synchronous DRAM. This DRAM operates in synchronism with an external clock and employs a pipeline structure perform a high speed data read/write operation. Such a synchronous DRAM is constituted as shown in FIG. 5. Note that only a data read/write circuit portion is shown and a memory cell array as well as peripheral circuits for selecting memory cell(s) are omitted in FIG. 5.

A command control circuit 10 receives external input signals $\overline{RAS}$, $\overline{CAS}$ and $\overline{WE}$ as well as an external clock signal CLK and produces a write activation signal WR and a read activation signal RE. An internal clock generation circuit 20 receives the external clock signal CLK and generates internal clock signals ICLK1, ICLK2 and ICLK3.

A write/read control circuit 30 receives the write activation signal WR, the read activation signal RE and the internal clock signal ICLK2 and outputs a writing pulse signal WPAL1 and a reading pulse signal RPAL. A write data buffer 40 comprises a D-F/F circuit which receives an external input data from a data terminal DQ and the internal clock signal ICLK1 and outputs a write data WDATA1. A write data latching circuit 50 also comprises a D-F/F circuit which latches the write data WDATA1 in synchronism with the internal clock signal ICLK2 and outputs it as a write data WDATA2.

A read/write bus driving circuit 62 receives the write data WDATA2 and the writing pulse signal WPAL1 and drives true and complementary read/write buses RWBUST and RWBUSN. A write switching circuit 70 receives data from the read/write buses RWBUST and RWBUSN and drives true and complementary write buses WBUST and WBUSN while outputting a write switching signal WSW. When either of the data sent from the read/write buses RWBUST and RWBUSN is at the low level (hereafter referred to as L), the write switching circuit 70 sets the write switching signal WSW to a high level (hereafter referred to as H) and outputs write-data onto the write buses WBUST and WBUSN. On other hand, when the both potentials of the read/write buses RWBUST and RWBUSN are H, the write switching circuit 70 sets the write switching signal WSW to L. That is, the outputs of the read/write bus driving circuit 62 serve as both reading data and control information.

A sense amplifier 80 receives data from the write buses WBUST and WBUSN when the write switching signal WSW is H, and outputs read-data to true and complementary read buses RBUST and RBUSN when the write switching signal WSW is L. A first data amplifier circuit 90 receives the data from the read buses RBUST and RBUSN and a reading pulse signal RPAL and outputs data to the read/write buses RWBUST and RWBUSN. Note that either voltage indicating H or the voltage indicating L transferred in to the buses RWBUST and RWBUSN by the data amplifier 90 is regarded as H by the write switching circuit 70.

A second data amplifier circuit 100 receives data from the read/write buses RWBUST and RWBUSN and the reading pulse signal RPAL and outputs read data RDATA1. A read data latching circuit 110 comprises a D-F/F circuit which receives the read data RDATA1 and the internal clock signal ICLK3 and outputs a read data RDATA2. A data out buffer 120 receives the read data RDATA2 and outputs an output data to the terminal DQ.

Figure 6:
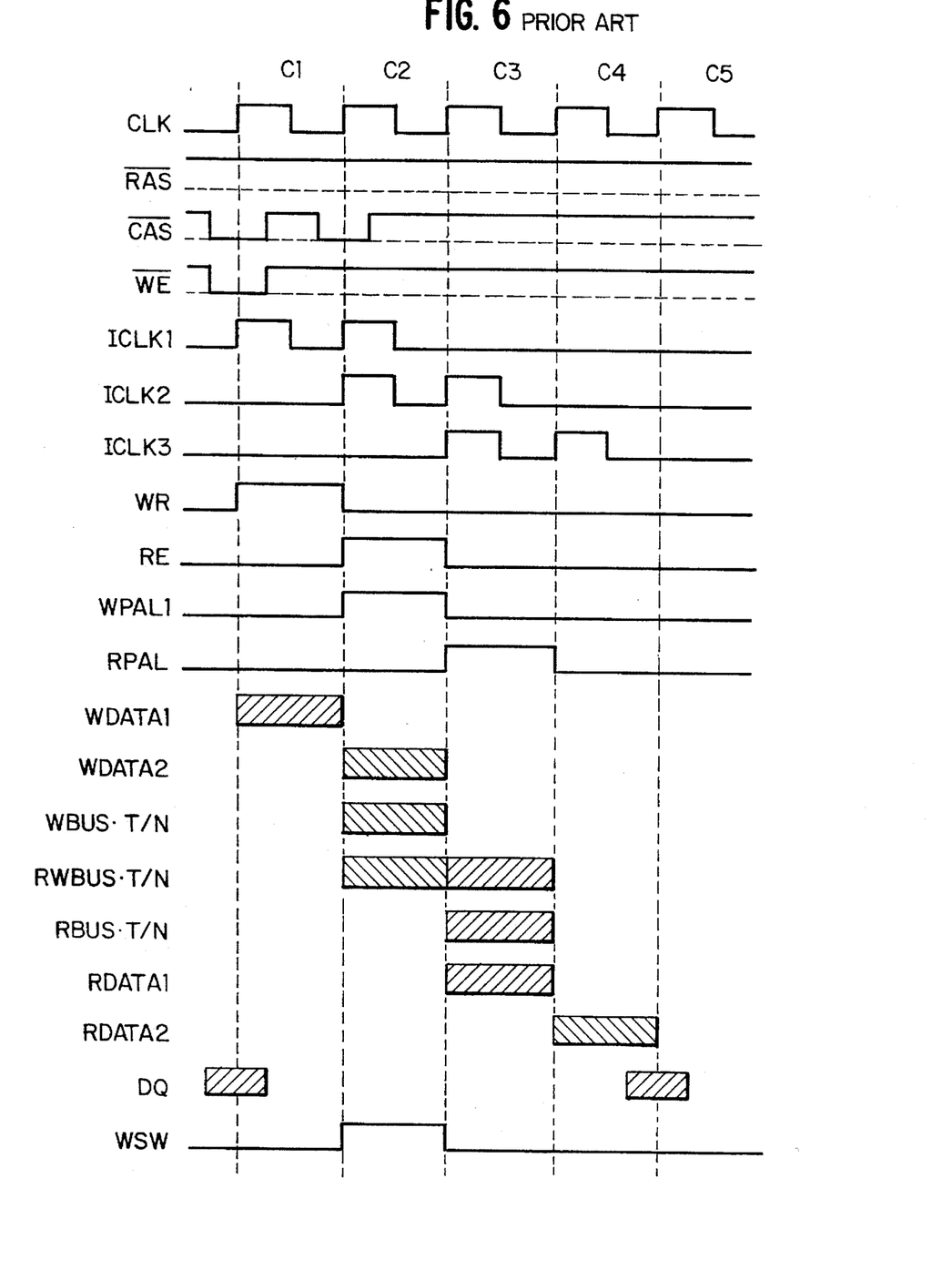
FIG. 6 is a waveform diagram showing the operation of the conventional example in FIG. 5.

The operation of the synchronous DRAM as shown in FIG. 5 is described below by referring to FIG. 6. First, the write operation is described below. An active command is first inputted to select one word line (not shown) and the input signals RAS, CAS and WE are then set to H, L, and L, respectively, at a cycle C1 in synchronism with the leading edge of the external clock signal CLK. The command control circuit 10 thereby outputs the write active high signal WR during the cycle C1. The clock generator 20 generates the internal clock signals ICLK1, ICLK2 and ICLK3 in the form of one-shot pulse in cycles C1, C2 and C3, respectively. Note that the write active high signal WR is changed to the L in the cycle C2. In response to one-shot internal clock signal ICLK2 in the cycle C2, the writing pulse signal WPAL1 becomes H during the cycle C2.

Write-data supplied to the terminal DQ is valid at the leading edge of the external input clock CLK in the cycle C1, so that the write data buffer circuit 40 latches the write-data in synchronism with the one-shot internal clock signal ICLK1 at the cycle C1 and outputs the write data WDATA1.

The write data latching circuit 50 latches the write data WDATA1 in synchronism with the one-shot internal clock signal ICLK2 and outputs the write data WDATA2. In response further to the one-shot internal clock signal ICLK2, the write/read control circuit 30 brings the writing pulse signal WPAL1 into H during the cycle C2.

When the writing pulse signal WPAL1 becomes H, the read/write bus driving circuit 62 fetches the write data WDATA2 and drives the read/write buses RWBUST and RWBUSN in response thereto. Since either one of the potentials on the read/write buses RWBUST and RWBUSN takes the L, the write switching signal WSW becomes H and the write-data is transferred to the sense amplifier 80 through the write switching circuit 70 and the write buses WBUST and WBUSN. The write-data is thus stored in the selected memory cell (not shown).

In a data read operation, on the other hand, the command control circuit 10 detects the input signals RAS, CAS and WE which are set to H, L and H, respectively, at the leading edge of the external clock signal CLK in the cycle C2 and brings the read activation signal RE into H during the cycle C2. The read activation signal RE is changed to L in the cycle C3. Moreover, the internal clock signals ICLK1, ICLK2, and ICLK3 are generated in the form of one-shot pulse at the cycles C2, C3 and C4, respectively.

The one-shot internal clock signal ICLK2 in the cycle C3 causes the reading pulse signal RPAL to become one-shot H. With respect to the read data, when the reading pulse signal RPAL becomes H at the cycle C3, the first data amplifier circuit 90 receives a read-data responsive to the data stored in the selected memory cell from the sense amplifier 80 through the read buses RBUST and RBUSN and drives the read/write buses RWBUST and RWBUSN in response thereto. The read-data on the read/write buses RWBUST and RWBUSN are then amplified by the second data amplifier circuit 100 and are outputted as the read-data RDATA1.

When the internal clock signal ICLK3 becomes one-shot H at the cycle C4, the read data latching circuit 110 latches the read-data RDATA1 and outputs the read-data RDATA2. The outputted read-data RDATA2 is then outputted to the terminal DQ through the data out buffer circuit 120.

Figure 7:
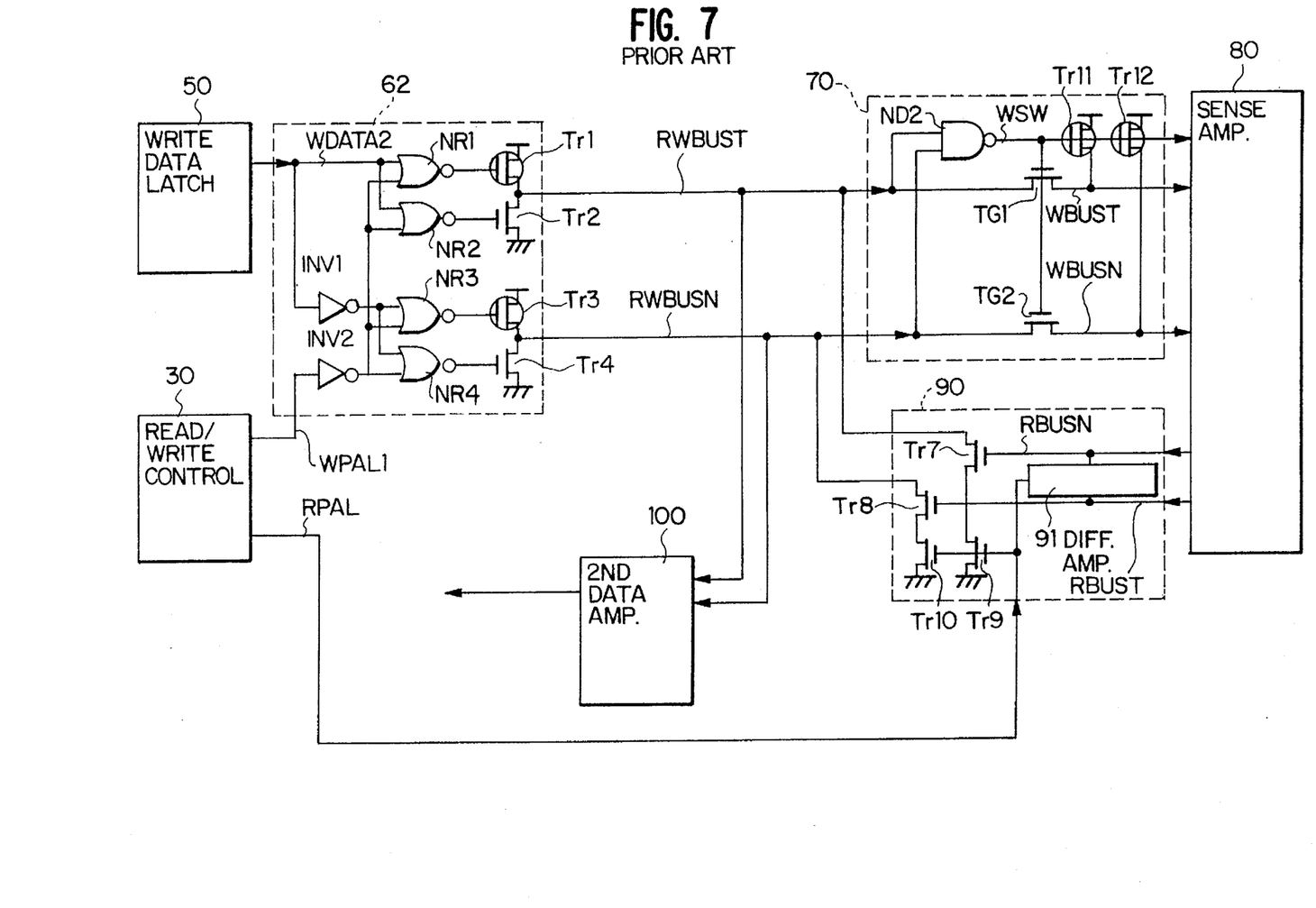
FIG. 7 is a circuit diagram showing a part of the conventional example in FIG. 5.

Referring to FIG. 7, there are shown detailed circuits of the read/write bus driving circuit 62, the write switching circuit 70 and the first data amplifier circuit 90.

The read/write bus driving circuit 62 comprises an inverter INV1 receiving the write data WDATA2, an inverter INV2 receiving the writing pulse signal WPAL1, two NOR gates NR1 and NR2 receiving the write data WDATA2 and the output of the inverter INV2, two NOR gates NR3 and NR4 receiving the output of the inverter INV1 and the output of the inverter INV2, a P-channel MOS transistor Tr1 receiving at the gate thereof the output of the NOR gate NR1 and connected between the power source and the true read/write bus RWBUST, an N-channel MOS transistor Tr2 receiving at the gate thereof the output of the NOR gate NR2 and connected between the ground and the read/write bus RWBUST, a P-channel MOS transistor Tr3 receiving at its gate the output of the NOR gate NR3 and connected between the power source and the complementary read/write bus RWBUSN, and an N-channel MOS transistor Tr4 receiving the output of the NOR gate NR4 and connected between the ground and the read/write bus RWBUSN.

The write switching circuit 70 comprises a NAND gate ND2 performing a NAND operation on the data of the read/write buses RWBUST and RWBUSN and producing the write switching signal WSW, a transfer gate TG1 receiving the write switching signal WSW and inserted between the read/write bus RWBUST and the write bus WBUST, a transfer gate TG2 receiving the write switching signal WSW and inserted between the read/write bus RWBUSN and the write bus WBUSN, a P-channel MOS transistor Tr11 receiving the write switching signal WSW and is arranged between the power source and the write bus WBUST, and a P-channel MOS transistor Tr12 receiving the write switching signal WSW and is arranged between the power source and the write bus WBUSN.

The first data amplifier circuit 90 is controlled by the reading pulse signal RPAL to amplify the voltage difference between the read buses RBUST and RBUSN. That is, the circuit 90 comprises a differential amplifier 91 connected between the read buses RBUST and RBUSN, N-channel MOS transistors Tr8 and Tr10 which are connected in series between the ground and the read/write bust RWBUST and N-channel MOS transistors Tr7 and Tr9 which are arranged between the ground and the read/write bus RWBUSN in series.

Figure 8:
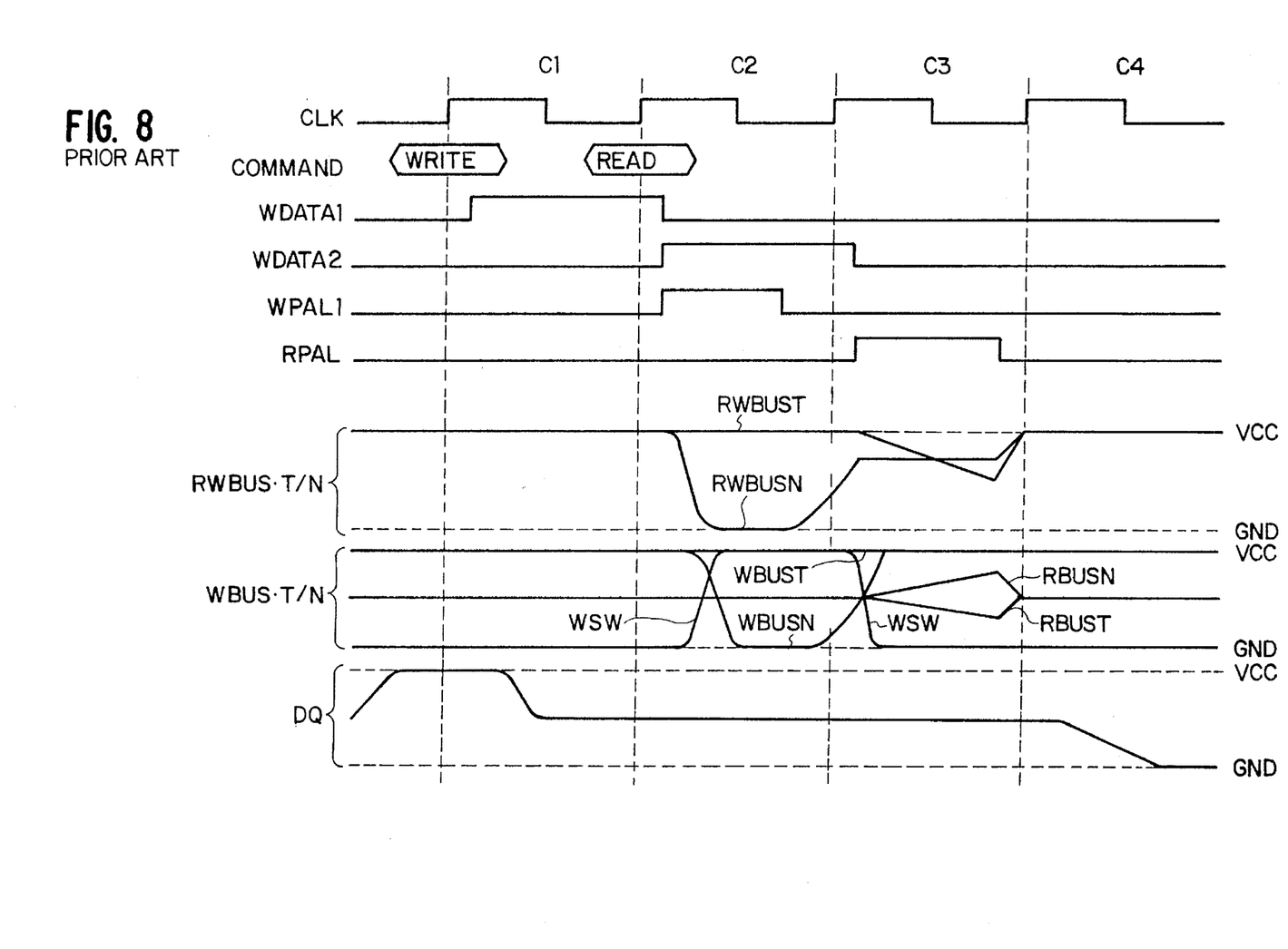
FIG. 8 is a waveform diagram showing the operation of the circuit in FIG. 5.

Further data read/write operations will be described below with reference also to FIG. 8.

During the period where the writing pulse signal WPAL1 is H in the cycle C2, either one of the read/write buses RWBUST and RWBUSN becomes H and the other bus becomes L in accordance with the level of the write-data WDATA2. The write switching signal WSW thereby becomes H and the transfer gates TG1 and TG2 are turned on. The data in the read/write buses RWBUST and RWBUSN are transferred to the write buses WBUST and WBUSN which have been precharged to H beforehand by the transistors Tr1 and Tr12. In this description, because the write-data WDATA2 is H, both the read/write bus RWBUST and the write bus WBUST become H and both the read/write bus RWBUSN and the write bus WBUSN become L.

Thereafter, when the writing pulse signal WPAL1 becomes L, both the read/write buses RWBUST and RWBUSN are precharged to H. Thereby, the write switching signal WSW becomes L and the transfer gates TG1 and TG2 are turned off. The write buses WBUST and WBUSN are thus precharged to H by the transistors Tr11 and Tr12.

Because the reading pulse signal RPAL is L during the cycle C2, the transistors Tr9 and Tr10 are turned off, and the differential amplifier 91 is not activated, the read buses RBUST and RBUSN being thereby balanced at a precharge level. In the cycle C3, the reading pulse signal RPAL becomes H to activate the differential amplifier 91, so that a potential difference is produced between the read buses RBUSN and RBUST in accordance with the data from the sense amplifier 80 in response to the data stored in the selected memory cell. At the same time, the transistors Tr9 and Tr10 are turned on.

At this time, because the writing pulse signal WPAL1 is L, the transistors Tr1 and Tr3 in the read/write bus driving circuit 62 are turned on and the N-type transistors Tr2 and Tr4 are turned off. Therefore, a first DC path passing through the transistor Tr1, the read/write bus RWBUST and the transistors Tr7 and Tr9 and a second DC path passing through the transistor Tr3, the read/write bus RBUSN, and the transistors Tr8 and Tr10 exist between the power source and the ground. The levels of the read/write buses RWBUST and RWBUSN are thereby determined by the ratio of on-resistances of those transistors in the first and second DC paths. However, because a potential difference is produced between the read buses RBUSN and RBUST connected respectively to the gates of the transistors Tr7 and Tr8, a difference creates between the on-resistances of the transistors Tr7 and Tr8. On the other hand, there is no difference in current capability between the P-type transistors Tr1 and Tr2 and between the N-type transistors Tr9 and Tr10. Accordingly, a potential difference is also produced between the read/write buses RWBUSN and RWBUST in correspondence to the potential difference between the read buses RBUST and RBUSN.

The potential difference thus appearing between the read/write buses RWBUSN and RWBUST is further amplified by the second data amplifier circuit 100 to obtain the read-data RDATA1. When the reading pulse signal RPAL becomes L, the read buses RBUST and RBUSN are balanced at and precharged to the initial level and the read/write buses RWBUST and RWBUSN are precharged to the power source level. The reading pulse is generated at a high speed by transferring data from the sense amplifier to the second data amplifier 100 at a very small potential difference.

In the above-mentioned DC paths, currents are normally consumed between the power source and the ground while the reading pulse signal RPAL is H. Therefore, it is necessary to minimize the sizes of the P-type transistors Tr1 and Tr3 and the N-type transistors Tr7, Tr8, Tr9 and Tr10 to suppress the operating current. In addition, if the potential of either of the read/write buses RWBUST and RWBUSN may go down than the threshold potential of the NAND gate ND2, the write switching signal WSW may become H. it is therefore necessary to determine the sizes of transistors in the DC paths so that the potentials of the read/write buses RWBUST and RWBUSN do not extremely go down during the read operation.

In the above semiconductor memory, however, there occur the following problems. Specifically, the transistors Tr1 and Tr3 are used not only to determine the levels of the read/write buses RWBUST and RWBUSN during the read operation and but also to precharge them during the write operation. In order to suppress a power consumption during the read operation, the driving capacity of the transistors Tr1 and Tr3 is required to be made small as mentioned above. For this reason, during the write operation, it takes a long period of time to precharge either one of the read/write buses RWBUS which has falled down to the ground level up to the power source level, so that the data write cycle is prolonged. Conversely, if the capacity of the precharging transistors Tr1 and Tr3 would be increased in order to shorten the cycle time, the current consumed in the DC path would increase.

There have been disclosed techniques for precharging in Japanese Patent Application Laid-Open No. Hei 3-134890 and Japanese Patent Application Laid-Open No. Sho 59-117774. In the circuits disclosed therein, a precharging transistor is turned ON during a short period of time determined by a one-shot pulse. If this circuit would be applied to precharge the read/write bus RWBUS, one of these buses RWBUS would be discharged to the ground level, so that the writing switching circuit would erroneously produce the switching signal WSW in spite of the data read operation. A maloperation would thus take place.

SUMMARY OF THE INVENTION

It is therefore an object of the present invention to provide an improved semiconductor memory device.

It is another object of the present invention to provide a semiconductor memory having a data read/write circuit in which a pair of read/write buses are precharged to a predetermined potential at a high speed in a data write operation with suppressing power consumption in a data read operation.

A semiconductor memory according to the present invention comprising a pair of read/write buses, a first bus driving circuit responding to a write-data and driving one of the read/write buses to a first potential and the other of the read/write buses to a second potential during a write operation, a second bus driving circuit responding to a read-data and driving one of the read/write buses to a third potential and the other of them to a fourth potential during a read operation, and a third bus driving circuit cooperates the first bus driving circuit to precharge both of the read/write buses to a precharge level for a predetermined time period after the write operation is completed.

With the above construction, when the write operation is completed, read/write buses are both precharged to the precharge level by both of the first and third bus driving circuit. During the read operation, on the other hand, the third driving circuit is deactivated. The potentials on the read/write buses are thereby determined by the first and second bus driving circuits. Accordingly, power consumption can be suppressed.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
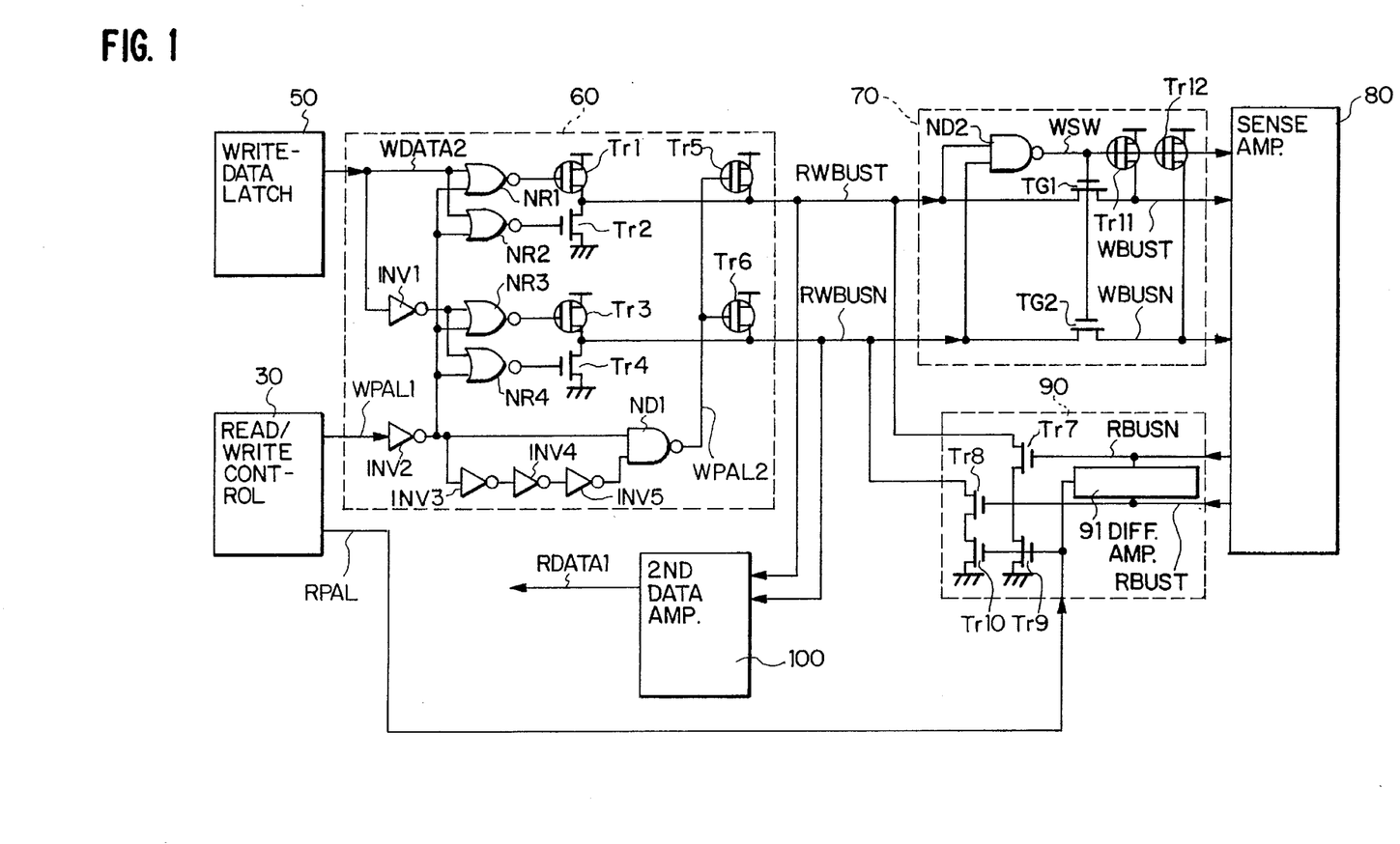
FIG. 1 is a circuit diagram illustrative a part of a memory device according to a first embodiment of the present invention.

Referring now to FIG. 1, there is shown a circuit diagram of a synchronous DRAM according to the first embodiment of the present invention, in which the same constituents as those shown in FIG. 7 are denoted by the same reference numerals and symbols to omit the further description thereof. Also in FIG. 1, only the data read/write circuit is shown and a memory cell array and peripheral circuits for selecting one or more memory cells in the celly array are omitted since they are not directly related to the present invention and are well known in the art.

As is apparent from the comparison between FIGS. 1 and 7, the memory device according to the present embodiment includes a read/write bus driving circuit 60 different from the read/write bus driving circuit 62 shown in FIG. 7.

More specifically, this circuit 60 further includes, in addition to the circuit components shown in FIG. 7, a delay circuit composed of inverters INV3 to INV5 and receiving the output of an inverter INV2, a NAND gate ND1 for receiving the outputs of the inverter INV2, and the delay circuit, a P-channel MOS transistor Tr5 receiving a writing pulse signal WPAL2 produced by the NAND gate ND1 and arranged between the power source line and the true read/write bus RWBUST, and a P-channel MOS transistor Tr6 receiving the writing pulse signal WPAL2 and arranged between the power source line and the complementary read/write bus RWBUSN.

Figure 2:
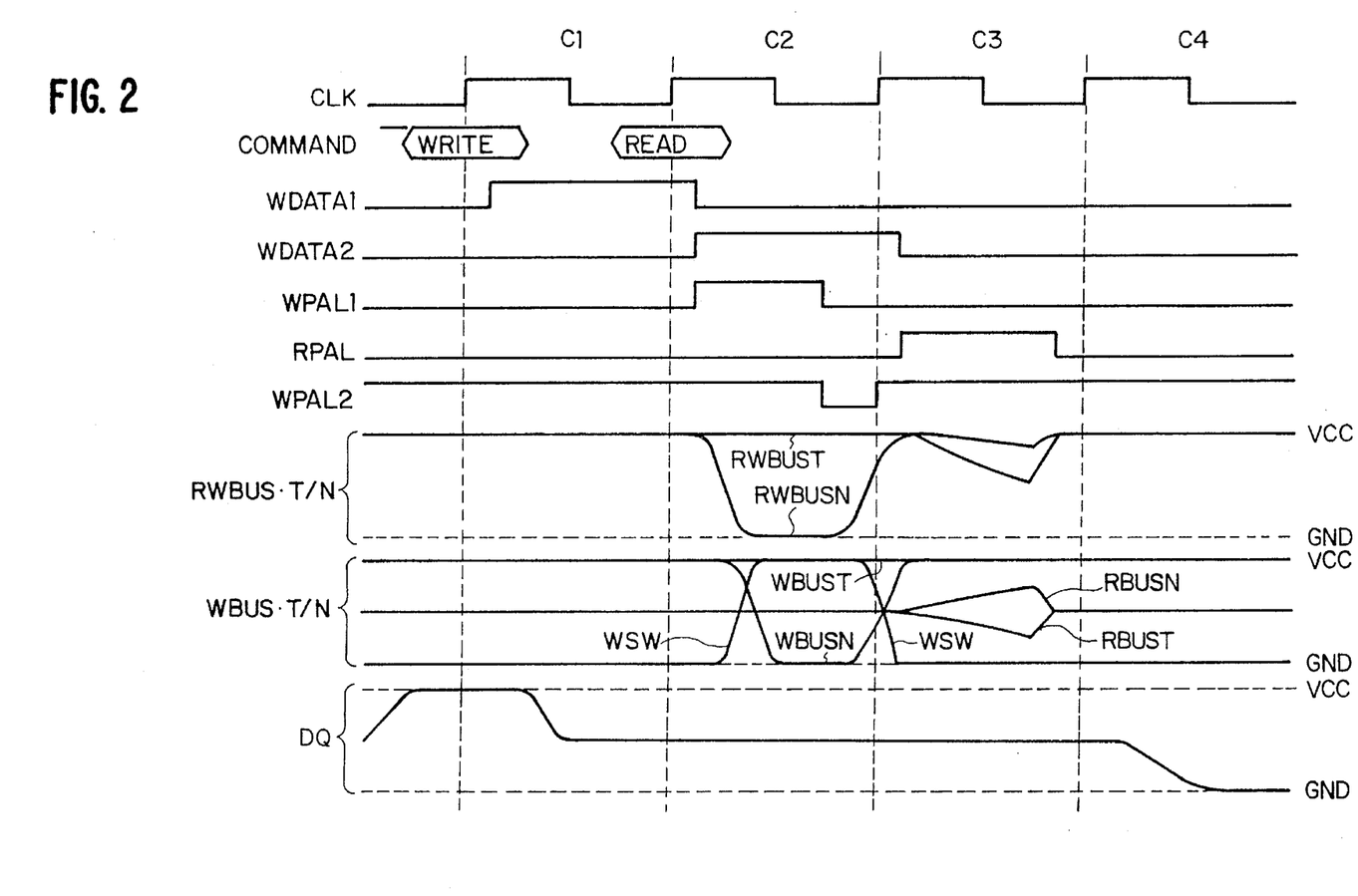
FIG. 2 is a waveform diagram showing an operation of the device shown in FIG. 1.

The operation of the circuit shown in FIG. 1 will be described below by referring also to FIG. 2. Since the delay circuit of inventors INV3 to INV5 and the NAND gate ND1 constitutes a one-shot pulse generator responsive to the writing pulse signal WPAL1, the writing pulse signal WPAL2 is generated in the form of a one-shot pulse in response to the falling edge of the signal WPAL1, as shown in FIG. 2. The transistors Tr5 and Tr6 are thereby turned on. That is, by the writing pulse signal WPAL1 changing to L, i.e., by the completion of the data writing, the transistors Tr1 and Tr3 are turned on and the transistors Tr5 and Tr6 are also turned on to precharge the read/write buses RWBUST and RWBUSN up to the power source level.

The writing pulse signal WPAL2 is a one-shot pulse and thus returned to H at time when the read operation is performed. The transistors Tr5 and Tr6 are thereby turned off during the read operation and only the transistors Tr1 and Tr3 form a conductive path between the power supply line and the read/write buses RWBUST and RWBUSN. During the read operation, a d.c. current flows through the transistors Tr1, Tr7 and Tr9 (Tr3, Tr8 and Tr10); however, since each of the transistors Tr1 and Tr3 is formed with a relatively small current capability, power consumption is suppressed. Moreover, the potentials on both the buses RWBUST and RWBUSN during the read operation are designed to be higher then the threshold voltage of the NAND gate ND2 in the writing switching circuit 70, the switching signal WSW is maintained at the low level.

Figure 3:
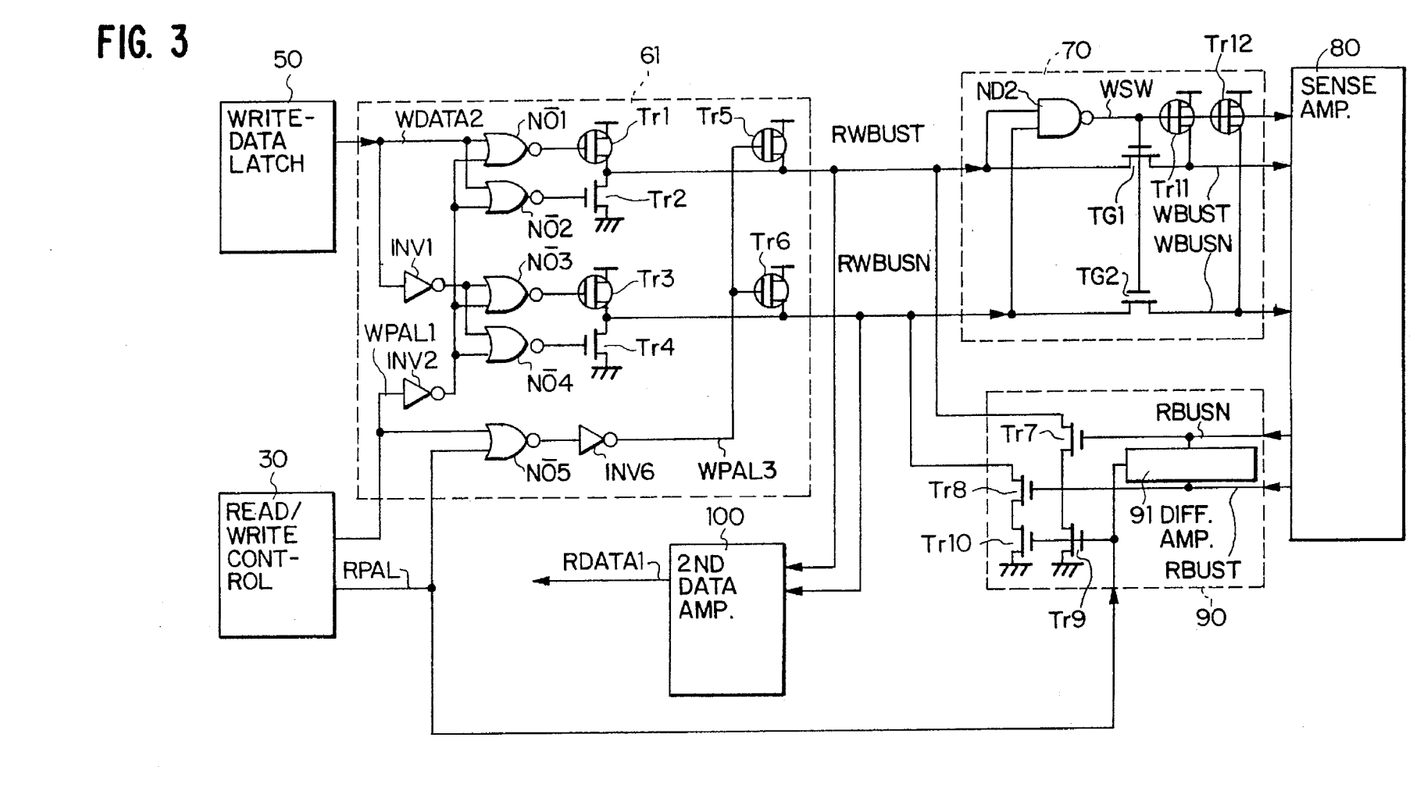
FIG. 3 is a circuit diagram illustrative of a part of a memory device according to a second embodiment of the present invention.

Turning to FIG. 3, a read/write bus driving circuit 61 according to the second embodiment of the present invention employs a NOR gate NO5 and an inverter INV6 in place of the delay circuit and the NAND gate ND1 as shown in FIG. 1. Specifically, the NOR gate NO5 receives the writing pulse signal WPAL1 and the reading pulse signal RPAL and the inverter INV6 receives the output of the NOR gate NO5. The output of the inverter INV6 is used as a writing pulse signal WPAL3 which is in turn supplied to the transistors Tr5 and Tr6.

Figure 4:
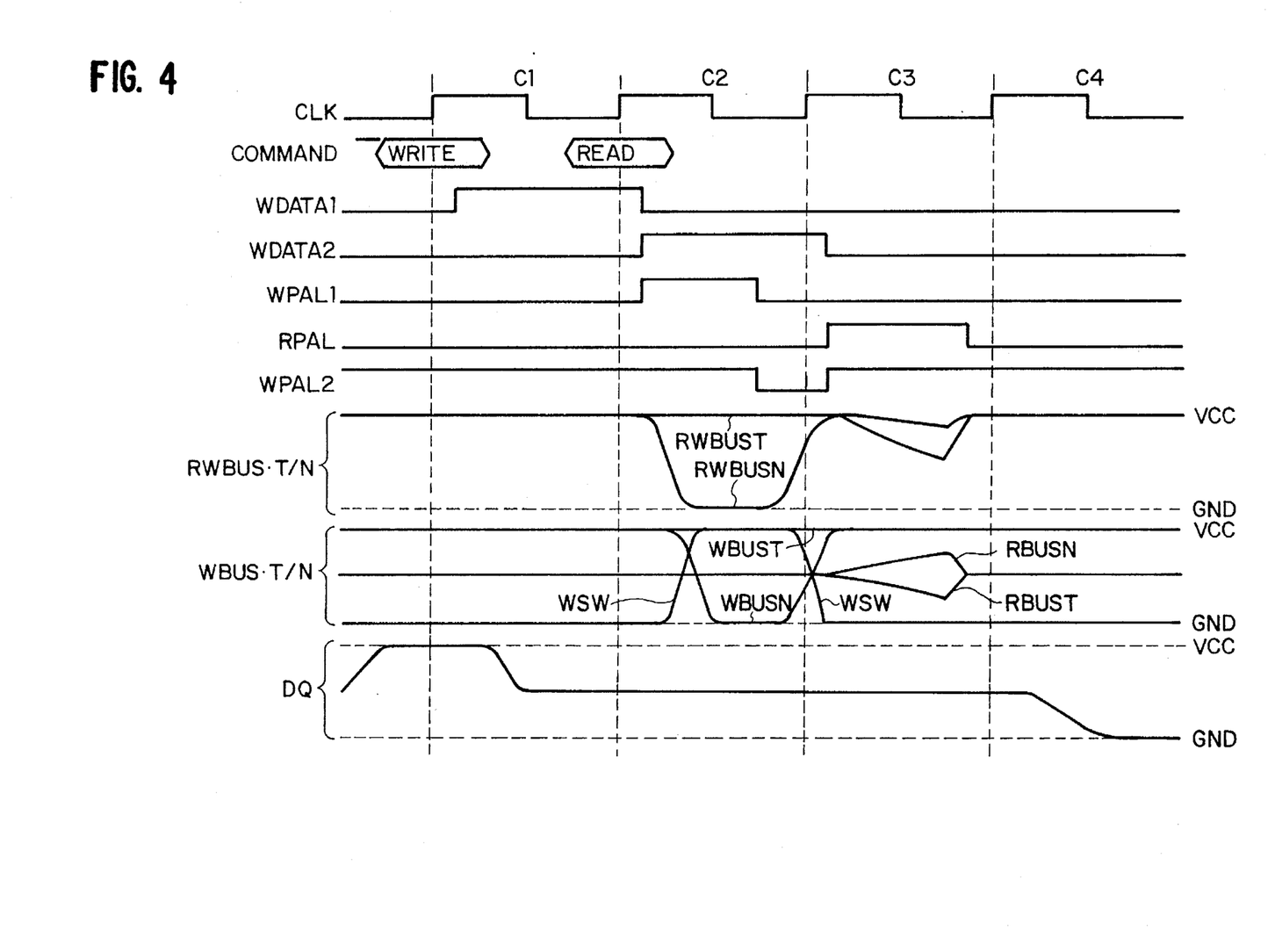
FIG. 4 is a waveform diagram showing an operation of the device shown in FIG. 3.

The operation of the embodiment in FIG. 3 is described below by referring to FIG. 4. When the writing pulse signal WPAL1 becomes L in the cycle C2, the writing pulse signal WPAL3 becomes L and the transistors Tr5 and Tr6 are turned on because the reading pulse signal RPAL is also L. That is, the transistors Tr1 and Tr3 are turned on immediately after the writing pulse signal WPAL1 has been turned on and the write operation has completed, and the transistors Tr5 and Tr6 are also turned on at the time of precharging the read/write buses RWBUST and RWBUSN to the power source level to precharge the read/write buses RWBUST and RWBUSN to the power source level.

When the reading pulse signal RPAL becomes H at the time of performing the read operation in the cycle C3, the writing pulse signal WRPAL3 returns to H. Therefore, the transistors Tr5 and Tr6 are turned off during the read operation and only the transistors Tr1 and Tr3 become the transistors for supplying power to the read/write buses RWBUST and RWBUSN.

As described above, in the present invention, the first read/write bus driving circuit charges both read/write bus pair to the first potential in a period other than the write operation and a third read/write bus driving circuit further energizes the charging. That is, it is possible to sufficiently and quickly charge the read/write buses and moreover shorten the cycle time without increasing the size of driving element in the first read/write bus driving circuit related to the read operation and increasing the power consumption for the read operation by driving the read/write bus pair to the first potential in at least a part of the period until the next write or read operation is started after the write operation has completed.

It is apparent that the present invention is not limited to the above embodiments but may be modified and changed without departing from the scope and spirit of the invention.

What is claimed is:

1. A semiconductor memory comprising a pair of read/write buses through which write data signals are transferred in a write operation and read data signals are transferred in a read operations, a first bus driving circuit responding to a write-data and driving one of said read/write buses to a first potential and the other of said read/write buses to a second potential during said write operation, said first bus driving circuit having a precharge circuit for precharging both of said read/write buses to a precharge level in response to a completion of said write operation; a second bus driving circuit responding to a read-data and driving one of said read/write buses to a third potential and the other of said read/write buses to a fourth potential during the read operation, and a third bus driving circuit cooperating with said precharge circuit to precharge both of said read/write buses to said precharge level for a predetermined period of time in response to the completion of said write operation.

2. The semiconductor memory as claimed in claim 1, wherein said first bus driving circuit is activated by a write control signal and said third bus driving circuit is activated upon termination of said write control signal.

3. The semiconductor memory as claimed in claim 2, wherein said third bus driving circuit includes a one-shot pulse generator responding to a termination of said write control signal and generating an one-shot pulse signal and precharge transistors precharging said read/write buses in response to said one-shot pulse signal.

4. The semiconductor memory as claimed in claim 1, wherein said first bus driving circuit is activated by a write control signal and said second bus driving circuit is activated by a read control signal, said third bus driving circuit being activated during a period of time when neither of said write control signal and said read control signal is present.

5. The semiconductor memory as claimed in claim 4, wherein said third bus driving circuit includes a gate circuit responsive to the absence of both of said write control signal and said read control signal for generating a precharge-enable signal to enable precharge transistors to precharge said read/write buses in response to said precharge-enable signal.

6. A semiconductor memory comprising a data bus, a first transistor coupled between said data bus and a first power supply line, a second transistor coupled between said data bus and a second power supply line, a gate circuit receiving a write-data and a write control signal and rendering one of said first and second transistors conductive in response to said write-data during said write control signal being at an active level, said gate circuit further rendering said first and second transistors conductive and non-conductive, respectively, during said write control signal being at an inactive level, third and fourth transistors coupled in series between said data bus and said second power supply line, first means for supplying a read-data to said third transistor, second means for rendering said fourth transistor conductive during a read control signal being at an active level and non-conductive during said read control signal being at an inactive level, a fifth transistor coupled between said data bus and said first power supply line, and third means responsive to at least said write control signal for rendering said fifth transistor conductive for a predetermined period of time in response to a change of said write control signal from said active level to said inactive level.

7. The memory as claimed in claim 6, wherein said third means includes a one-shot pulse generator generating a one-shot pulse in response to said change of said write control signal from said active level to said inactive level, and said fifth transistor is rendered conductive in response to said one-shot pulse.

8. The memory as claimed in claim 6, wherein said third means further responds to said read control signal and produces a precharge control signal during both of said write control signal and said read control signal being at said inactive level, said fifth transistor being rendered conductive in response to said precharge control signal.

* * * * *

UNITED STATES PATENT AND TRADEMARK OFFICE
CERTIFICATE OF CORRECTION

PATENT NO. : 5,502,684
DATED : March 26, 1996
INVENTOR(S) : Yasuji KOSHIKAWA

It is certified that error appears in the above-indentified patent and that said Letters Patent is hereby corrected as shown below:

Column 7, line 11, delete "NO5" and insert -- $N\bar{O}5$ --;

line 13, delete "NO5" and insert -- $N\bar{O}5$ --;

line 16, delete "NO5" and insert -- $N\bar{O}5$ --.

Signed and Sealed this

Third Day of September, 1996

Attest:

BRUCE LEHMAN

Attesting Officer        Commissioner of Patents and Trademarks